United States Patent [19]

Bulat et al.

[11] Patent Number: 5,066,603
[45] Date of Patent: Nov. 19, 1991

[54] METHOD OF MANUFACTURING STATIC INDUCTION TRANSISTORS

[75] Inventors: Emel S. Bulat, Framingham; Brian T. Devlin, Haverhill, both of Mass.

[73] Assignee: GTE Laboratories Incorporated, Waltham, Mass.

[21] Appl. No.: 403,621

[22] Filed: Sep. 6, 1989

[51] Int. Cl.$^5$ ............................................ H01L 21/265
[52] U.S. Cl. ........................................ 437/29; 437/38; 437/40; 437/67; 437/203; 437/228; 357/22
[58] Field of Search ................ 437/29, 38, 67, 40, 437/203, 228; 357/22, 89, 90, 23.5

[56] References Cited

U.S. PATENT DOCUMENTS

| | | | |
|---|---|---|---|
| 3,500,139 | 3/1970 | Frouin et al. | 437/67 |
| 3,979,237 | 9/1976 | Morcom et al. | 148/DIG. 51 |
| 4,104,086 | 8/1978 | Bonclur et al. | 437/67 |
| 4,228,450 | 10/1980 | Anantha et al. | 437/67 |
| 4,466,180 | 8/1984 | Soclof | 437/67 |
| 4,520,552 | 6/1985 | Armould et al. | 437/67 |
| 4,543,706 | 10/1985 | Bencuya et al. | 437/67 |
| 4,608,582 | 8/1986 | Nishizawa | 357/22 |
| 4,683,643 | 8/1987 | Nakajima et al. | 437/203 |
| 4,746,963 | 5/1988 | Uchida et al. | 437/67 |
| 4,835,586 | 5/1989 | Cogan et al. | 357/22 |
| 4,845,051 | 7/1989 | Cogan et al. | 437/203 |

OTHER PUBLICATIONS

Park, Kwang D. (GTE Lab Inc.), "Reactive Sputter Etching of Single Crystalline Silicon with Chlorine and Tetrachlorosilane", Proc.-Symposium. Plasma Process, 4th, 257-262, 1983.

*Primary Examiner*—Brian E. Hearn
*Assistant Examiner*—Tom Thomas
*Attorney, Agent, or Firm*—David M. Keay; Victor F. Lohmann, III

[57] ABSTRACT

In fabricating a junction field effect transistor, specifically a static induction transistor, an epitaxial layer of high resistivity N-type silicon is grown on a substrate of low resistivity silicon. The surface of the epitaxial layer is marked in a pattern to expose a plurality of elongated surface areas. The wafer is subjected to reactive ion etchings in $SiCl_4$ and $Cl_2$ and subsequently in $Cl_2$ to form parallel grooves with rounded intersection between the wide walls and bottoms of the grooves. Ridges of silicon are interposed between grooves. A layer of silicon oxide is grown on all the silicon surfaces. The grooves are filled with deposited silicon oxide and silicon oxide is removed to form a planar surface with the upper surfaces of the ridges. P-type conductivity imparting material is ion implanted into alternate (gate) ridges and diffused to form gate regions which extend laterally beneath the silicon dioxide in the adjacent grooves, N-type conductivity imparting material is ion implanted in the top of the intervening (source) ridges. Metal contacts are applied to the gate ridges, source ridges, and the bottom of the substrate.

8 Claims, 3 Drawing Sheets

METHOD OF MANUFACTURING STATIC INDUCTION TRANSISTORS

BACKGROUND OF THE INVENTION

This invention relates to semiconductor devices. More particularly, it is concerned with junction field effect transistors of the static induction type and to methods of fabricating.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode. These devices are described by Nishizawa et al. in U.S. Pat. No. 3,828,320 issued Aug. 6, 1974, and in U.S. Pat. No. 4,199,771 issued Apr. 22, 1980. See also an article entitled "High Performance Microwave Static Induction Transistors" by Cogan et al., published in the proceedings of the International Electronic Devices Meeting (IEEE). Dec. 5, 6 and 7, 1983. Washington. D.C., paper 9.5, page 221.

The static induction transistor generally uses vertical geometry with source and drain electrodes placed on opposite sides of a thin, high resistivity layer of one conductivity type. Gate regions of the opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, a source-drain current and voltage derived from an attached energy source will also vary.

One factor which limits the operation of static induction transistors at high frequency is gate capacitance. In order to obtain a high voltage gain the gate junction must be located in the immediate vicinity of the source. A very short gate-to-source distance, however, causes the gate capacitance to be high. In addition, a short gate-to-source distance requires extremely tight tolerances and process control during device fabrication. One form of static induction transistor, labeled a recessed gate static induction transistor, which alleviates certain of the foregoing problems and a method for its manufacture are described in U.S. Pat. No. 4,611,384, issued Sept. 16, 1986, to Bencuya et al.

SUMMARY OF THE INVENTION

An improved method of fabricating a junction field effect transistor in accordance with the present invention comprises providing a body of semiconductor material including a first layer of semiconductor material of one conductivity type of relatively high resistivity and a second layer of semiconductor material of the one conductivity type of relatively low resistivity contiguous with the first layer. The first layer has a surface at the surface of the body. A plurality of parallel grooves are formed through the surface into the first layer of semiconductor material producing interposed ridges of semiconductor material. Each of the grooves has side walls formed by the adjacent ridges of semiconductor material and has a bottom. Alternate ridges are gate ridges and intervening ridges, between the gate ridges are source ridges. A layer of a first nonconductive protective material is formed adherent to the side walls and bottoms of the grooves. The remainder of the grooves are filled with a second nonconductive protective material so as to produce surfaces thereof which are continuous with the surfaces of the ridges. Conductivity type imparting material of the opposite conductivity type is introduced into the gate ridges of semiconductor material at the surfaces to convert zones of the first layer to the opposite conductivity type thereby forming gate regions of the opposite conductivity type. Each of the gate regions include the associated gate ridge and has portions extending laterally beneath the bottoms of the adjacent grooves toward the laterally extending portions associated with the adjacent gate ridges to produce a channel region of the one conductivity type of relatively high resistivity between them. Conductivity type in parting material of the one conductivity type is introduced into the source ridges of semiconductive material at the surfaces to produce source regions of the one conductivity type of relatively low resistivity in a zone adjacent to the surface in each of the source ridges. Conductive contacts are applied to form electrical contacts in ohmic contact with the source and gate regions at the surfaces of the source and gate regions, respectively.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above described drawings.

DETAILED DESCRIPTION OF THE INVENTION

In fabricating junction field effect transistors of the static induction type in accordance with the invention as illustrated in the figures, a substrate of single crystal semiconductor material of one conductivity type is provided as a supporting structure. As is well understood, the substrate is usually a slice or wafer of relatively large surface area. For purposes of illustration, however, the fabrication of only a portion of a single static induction transistor in a fragment of a slice will be shown and described. In the following description silicon is employed as the semiconductor material and the substrate is of relatively low resistivity N-type conductivity.

Figure 1:
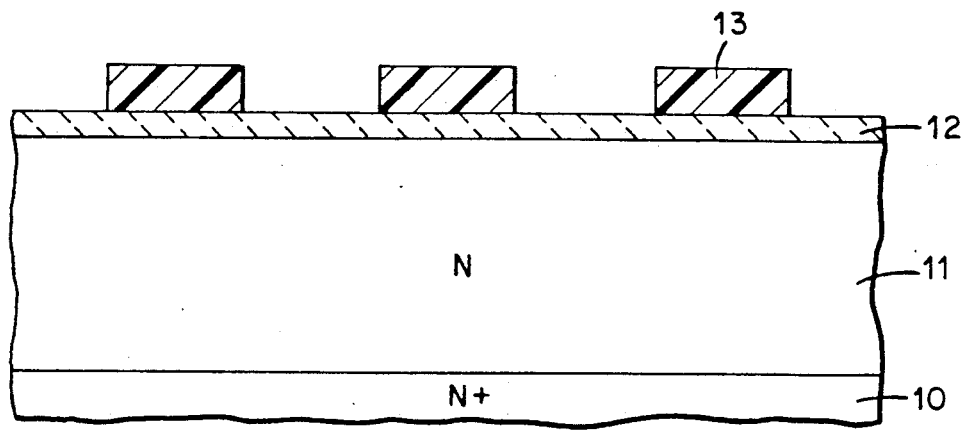
FIGS. 1-8 are a series of elevational views in cross-section of a fragment of a wafer of semiconductor material illustrating successive steps in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the known techniques of crystal fabrication including appropriate slicing and cleaning operations. An epitaxial layer 11 which is precisely controlled as to thickness and as to resistivity and which is a continuation of the crystalline structure of the single crystal substrate 10 is then grown on the surface of the substrate. The upper surface of the epitaxial layer 11 is parallel to the interface between the substrate and the layer.

The surface of the wafer is covered with an adherent protective layer of silicon oxide 12. The silicon oxide layer 12 is covered with a layer 13 of photoresist material. By employing standard photoresist masking and etching techniques portions of the photoresist layer are removed to expose the surface of the silicon oxide 12 in a pattern of elongated parallel areas. The wafer is etched to remove the exposed silicon oxide 12 as by anisotropically etching in a plasma etching apparatus. The photoresist 13 serves as a mask during this operation so that only the exposed silicon oxide is removed to the underlying surface of the epitaxial layer. The photoresist 13 is then removed.

Figure 2:
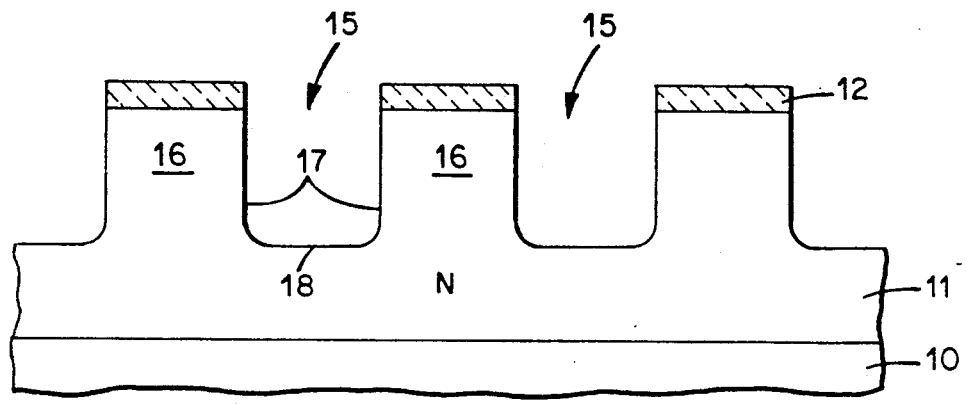

The wafer is placed in a reactive ion etching apparatus, specifically a parallel plate reactor (Plasmatherm PK244 Etcher). First the surface is cleaned by sputtering in an argon atmosphere. Then the wafer is etched by reactive ion etching in an atmosphere of $SiCl_4$ and $Cl_2$. This etching procedure produces a very clean vertical cut of the side walls 17 of the grooves 15 which are formed, as illustrated in FIG. 2. In a subsequent step only $Cl_2$ is used as the etching atmosphere, producing the rounded corners between the side wall 17 and the bottoms 18 of the grooves 15. Thus, a plurality of elongated parallel grooves or trenches 15 are formed leaving interposed between them finger-like ridges 16 of silicon. Each of the grooves 15 has opposite side walls 17 formed by the two adjacent ridges 16 and also an end wall or bottom 18 with rounded intersections between the side walls 17 and the bottoms 18.

Figure 3:
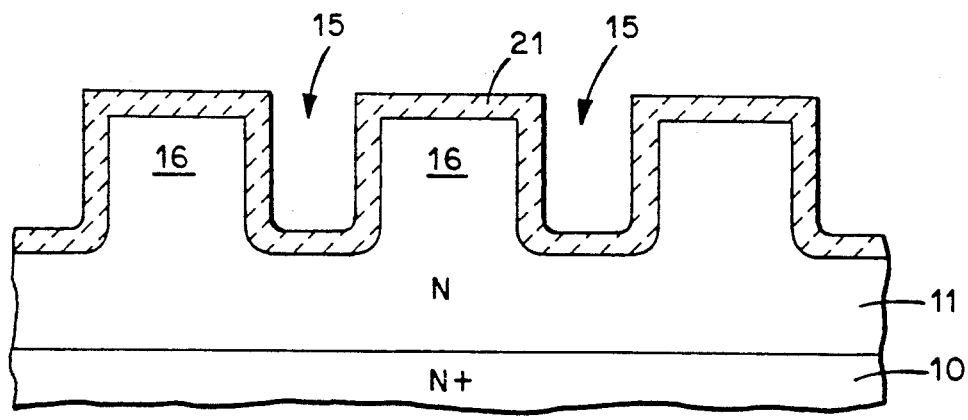

The thick masking layer of silicon oxide 12 is then removed and the wafer is treated by heating at an elevated temperature in an oxygen atmosphere in accordance with known techniques to produce a grown silicon oxide layer 21. The silicon oxide layer 21 covers the entire exposed upper surfaces of the wafer including the side walls 17 and bottoms 18 of the grooves and the upper surfaces of the ridges 16, as shown in FIG. 3.

Figure 4:
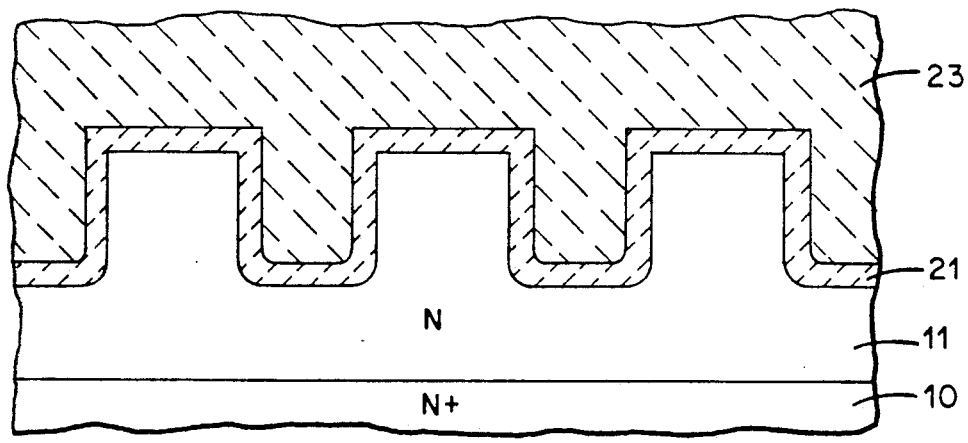
Figure 5:
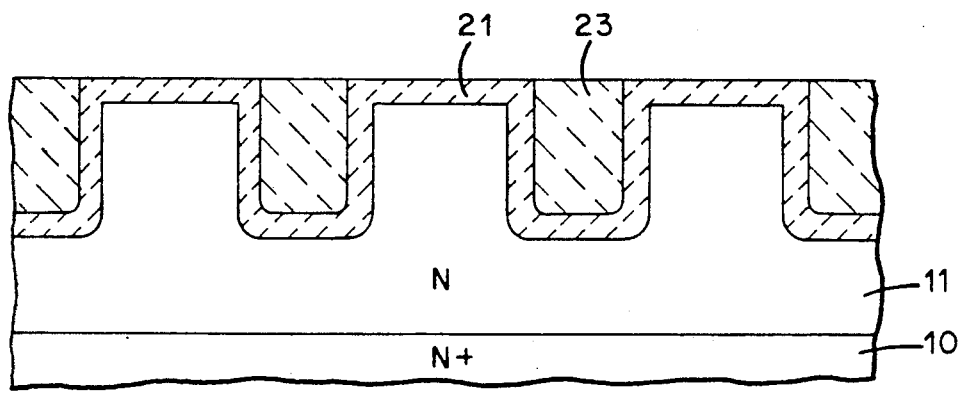
Figure 6:
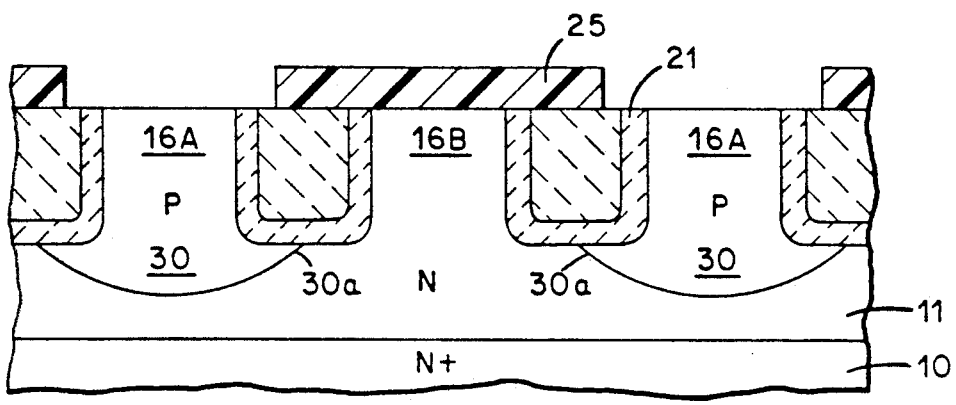

Next, by employing conventional vapor deposition techniques a layer of silicon oxide 23 is formed over the surface of the wafer completely filling in the grooves and also overlying the surfaces to ensure that the grooves are completely filled (FIG. 4). After this conformal oxide deposition, a planarization etch is employed to expose the areas of the surface which are to be the active regions of the device. The portions of the wafer outside of the active areas are suitably protected and the wafer is treated by an isotropic wet etch in a buffered hydroflouric acid solution. Etching is completed while optically monitoring the end point so as to remove all of the deposited oxide 23 overlying the wafer except in the groves 15 as illustrated in FIG. 5 and subsequently the portions of the thermally grown oxide layer 21 overlying the ridges so as to expose the top of the ridges 16 as illustrated in FIG. 6. Alternative techniques of filling the grooves to the level illustrated in FIG. 5 may also be employed. For example, electronic cyclotron resonance (ECR) planar oxide deposition procedures may be employed which permit the grooves to be filled without the necessity for depositing a thick layer and subsequently etching to obtain planarization.

With the surfaces of the ridges 16 exposed, a thin (150 angstroms) implant silicon oxide layer is grown on the surface. The implant oxide helps to prevent channeling of the implanted ions along silicon grain boundaries. By employing known techniques, a layer of photoresist material 25 is applied to the surface of the wafer and then selectively removed to expose alternate ridges 16A while leaving protected the intervening ridges 16B as illustrated in FIG. 6. P-type conductivity imparting material is then introduced into the silicon at the exposed surfaces of the alternate ridges 16A by conventional ion implantation techniques. The photoresist layer 25 protects the remaining surface areas of the wafer. After ion implantation, the photoresist layer 25 is removed and the wafer is heated to cause the implanted conductivity type imparting material to diffuse throughout the alternate ridges 16A and laterally as well as vertically from the bases of the ridges 16A. As illustrated in FIG. 6 zones of P-type conductivity 30 are thus produced inset in the high resistivity N-type material of the epitaxial layer 11. The laterally extending portions 30a of the P-type zones 30 extend beneath the adjacent silicon oxide 23 and 21 in the grooves 15 toward the laterally extending portions 30a of the P-type zones 30 from the adjacent alternate ridges 16A.

Figure 7:
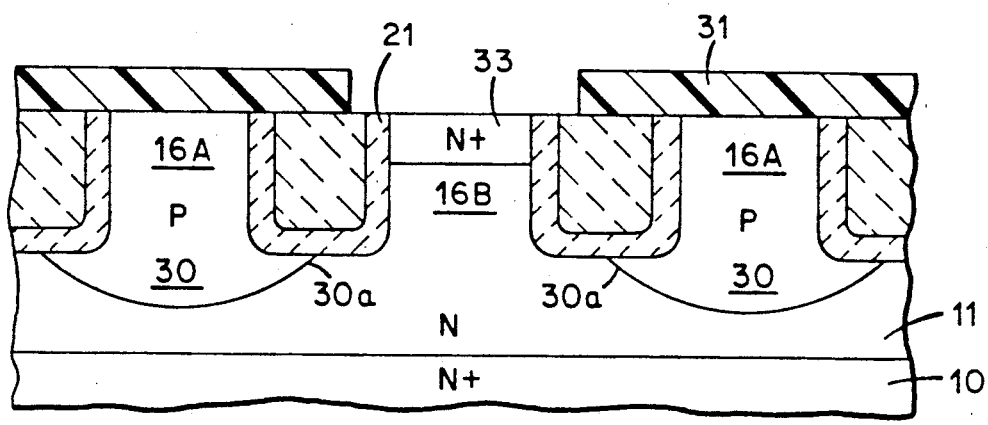

As illustrated in FIG. 7, a layer of photoresist material 31 is then placed on the surface of the wafer and selectively removed to expose the surfaces of the intervening ridges 16B. The wafer is subjected to treatment in conventional ion implantation apparatus to implant N-type conductivity material in the zones 33 at the upper surface of the intervening ridges 16B. The photoresist layer 31 is then removed and the wafer is annealed in order to activate the implanted ions forming the source regions 33.

Ohmic contacts 34 and 35 to the source regions 33 and gate regions 30, respectively. (FIG. 8) are then formed by any known techniques of metallization such as the formation of cobalt disilicide contacts or the selective deposition of tungsten with further metallization. The gate contacts 35 are appropriately connected together and to a gate bonding pad (not shown). and the source contacts 34 are appropriately connected together and to a source bonding pad (not shown) in a conventional manner. A metal layer 32 is applied to the bottom surface of the substrate 10 in order to provide a suitable drain contact member as illustrated in FIG. 8.

Figure 8:
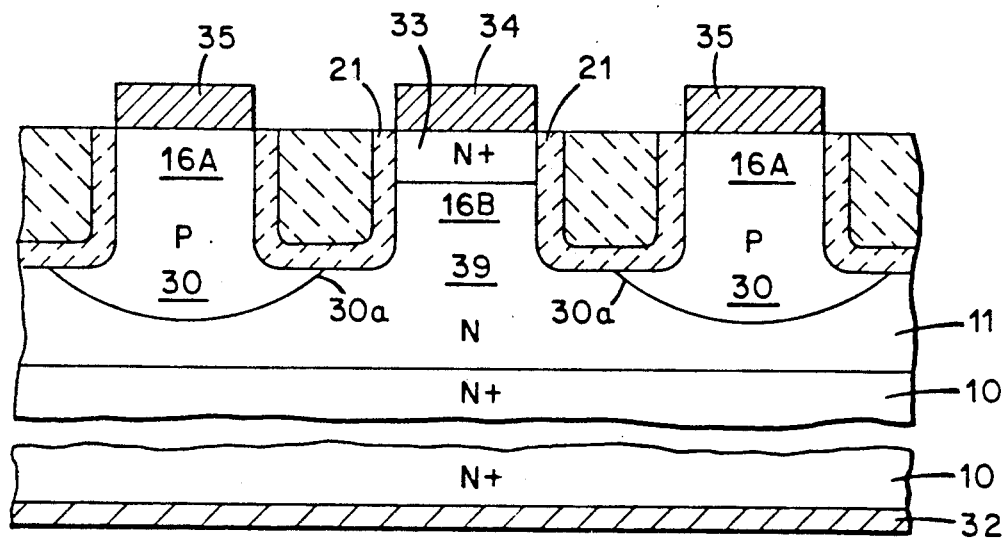

The resulting junction field effect transistor (JFET) as illustrated in FIG. 8 includes source regions 33 of low resistivity N-type silicon in the intervening ridges 16B and a drain region of low resistivity N-type silicon provided by the substrate 10. Channel regions 39 of high resistivity N-type silicon between each source region 33 and the drain region 10 lie between the laterally extending portions 30a of the P-type gate regions 30.

In the fabrication of an exemplary static induction transistor structure in accordance with the present invention, the substrate 10 may be a slice of single crystal N-type silicon doped with antimony to provide a uniform resistivity of 0.01 to 0.05 ohm-centimeters. The N-type epitaxial layer 11 of relatively high resistivity silicon is doped with arsenic during deposition to provide a uniform resistivity of about 10 ohm-centimeters. The epitaxial layer 11 may be about 10 micrometers thick. The grooves 15 are about 0.5 to 1.5 micrometer deep and approximately 0.75 to 1.5 micrometers wide although they might be wider if desired. The interposed ridges 16 may have a width approximately the same as the grooves. The grooves may be formed by reactive ion etching in an atmosphere which is about one-third $SiCl_4$ and two-thirds $Cl_2$, and then in an atmosphere of $Cl_2$ so as to produce slightly rounded intersection with no sharp corners between the side walls 17 and bottoms 18 of the etched grooves 15. The P-type gate regions 30 are formed by ion implanting and then diffusing boron into the wafer. After the boron implantation the wafer is heated at a temperature of 1000° C. for about 10 hours. Arsenic is implanted to form the N-type source regions 33. Subsequent to implanting the arsenic ions the wafer is treated by rapid thermal annealing at a temperature of about 1025° C. for about 1 to 2 minutes.

The method as disclosed produces a final device as illustrated in FIG. 8 which is a static induction transistor having a relatively large gate-to-source distance by virtue of the vertical displacement of the gate-channel junctions from the surface by the intervening grooves filled with silicon oxide. This spacing is obtained while providing a relatively narrow channel between the laterally extending portions of the gate regions: the width of the channel regions being determined relatively free of the gate-to-source spacing. In addition, positioning the gate-channel junctions below the surface of the wafer contributes to improved breakdown voltage characteristics. The process by which the grooves are formed provides vertical control of the grooves without laterally undercutting the intervening ridges, thus producing accurate, precise, well-aligned grooves and ridges. Consequently, the P-type conductivity imparting material which defines the gate regions can be driven vertically without lateral diffusion except beneath the oxide-filled grooves. The active ridges of the device are then defined by alignment with the grooves and ridges thus alleviating the necessity for precise alignment and mask registration during subsequent processing steps. The ability to produce devices having a small pitch (lateral distance between active regions) permits small junction areas resulting in reduced junction capacitance. A high gain, low gate capacitance static induction transistor is thus provided without requiring tight tolerances during fabrication.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a junction field effect transistor comprising
providing a body of semiconductor material including a first layer of semiconductor material of one conductivity type of relatively high resistivity and a second layer of semiconductor material of the one conductivity type of relatively low resistivity contiguous with said first layer, said first layer having a surface at a surface of the body:
forming a plurality of parallel grooves through said surface into said first layer of semiconductor material producing interposed ridges of semiconductor material, each of said grooves having side walls formed by the adjacent ridges of semiconductor material and having a bottom; alternate ridges being gate ridges and intervening ridges between the gate ridges being source ridges:
forming layers of a first nonconductive, protective material adherent to the side walls and bottoms of said grooves:
filling the remainder of said grooves with a second nonconductive protective material to produce surfaces thereof continuous with the surfaces of said ridges:
introducing conductivity type imparting material of the opposite conductivity type into the gate ridges of semiconductor material at said surfaces to convert zones of said first layer of semiconductor material to said opposite conductivity type thereby forming gate regions of the opposite conductivity type, each of said gate regions including the associated gate ridge and having portions extending laterally beneath the bottoms of the adjacent grooves toward the laterally extending portions associated with adjacent gate ridges to produce channel regions of the one conductivity type of relatively high resistivity therebetween;
introducing conductivity type imparting material of the one conductivity type into the source ridges of semiconductor material at said surfaces to produce a source region of the one conductivity type of relatively low resistivity in a zone adjacent to the surface in each of said source ridges; and
applying conductive material to form electrical contact in ohmic contact with said source and gate regions at the surfaces of said source and gate ridges, respectively.

2. The method in accordance with claim 1 wherein forming layers of a first nonconductive, protective material adherent to the side walls and bottoms of said grooves includes
treating the body of semiconductor material to convert exposed semiconductor material to said first nonconductive, protective material.

3. The method in accordance with claim 2 wherein forming a plurality of parallel grooves includes
placing a layer of masking material on the surface of the body to expose a plurality of surface areas in the pattern of said grooves; and
reactive ion etching exposed semiconductor material to form said plurality of grooves.

4. The method in accordance with claim 3 wherein
introducing conductivity type imparting material of the opposite conductivity type into the gate ridges at said surfaces to convert zones of said first layer to said opposite conductivity type includes
ion implanting conductivity type imparting material of the opposite conductivity type into the gate ridges at the surfaces thereof; and
heating to diffuse ion implanted conductivity type imparting material of the opposite conductivity type into said zones of said first layer.

5. The method of fabricating a junction field effect transistor comprising
providing a body of silicon including a first layer of silicon of one conductivity type of relatively high resistivity and a second layer of silicon of the one conductivity type of relatively low resistivity contiguous with said first layer, said first layer having a flat, planar surface at a surface of the body, and the first and second layers having a flat planar interface parallel with said surface of the body:
placing a layer of masking material on said surface on a pattern to expose a plurality of elongated parallel surface areas:
reactive ion etching exposed silicon to form a plurality of parallel grooves into said first layer of silicon with interposed ridges of silicon as defined by the pattern of said layer of masking material, each of said grooves having side walls formed by the adjacent ridges of silicon and having a bottom, alternate ridges being gate ridges and intervening ridges between the gate ridges being source ridges;
removing said layer of masking material;
exposing the body of silicon to oxygen at an elevated temperature to grow silicon oxide on the side walls and bottoms of the grooves and on the surfaces of the interposed ridges;
depositing a nonconductive protective material to fill the grooves;
removing nonconductive protective material and silicon oxide overlying the surfaces of the ridges to produce a continuous, flat, planar surface including exposed silicon surfaces of the ridges;
introducing conductivity type imparting material of the opposite conductivity type into the gate ridges of silicon at said surfaces to convert zones of said first layer of silicon to said opposite conductivity type thereby forming gate regions of the opposite conductivity type, each of said gate regions including the associated gate ridge and having portions extending laterally beneath the bottoms of the adjacent grooves toward the laterally extending portions associated with adjacent gate ridges to produce channel regions of the one conductivity type of relatively high resistivity therebetween;
introducing conductivity type imparting material of the one conductivity type into the source ridges of silicon at said surfaces to produce a source region of the one conductivity type of relatively low resistivity in a zone adjacent to the surface in each of said source ridges; and
applying conductive material to form electrical contact in ohmic contact with said source and gate regions at the surfaces of said source and gate ridges, respectively.

6. The method in accordance with claim 5 wherein reactive ion etching includes
reactive ion etching the body in an atmosphere consisting essentially of $SiCl_4$ and $Cl_2$; and subsequently
reactive ion etching the body in an atmosphere consisting essentially of $Cl_2$.

7. The method in accordance with claim 6 wherein introducing conductivity type imparting material of the opposite conductivity type into the gate ridges at said surfaces to convert zones of said first layer to said opposite conductivity type includes
ion implanting conductivity type imparting material of the opposite conductivity type into the gate ridges at the surfaces thereof; and
heating to diffuse ion implanted conductivity type imparting material of the opposite conductivity type into said zones of said first layer.

8. The method in accordance with claim 7 wherein exposing the body of silicon to oxygen at an elevated temperature to grow silicon oxide grows silicon oxide approximately 2000 angstroms thick.

* * * * *